United States Patent [19]

Nogami et al.

[11] Patent Number: 5,068,539
[45] Date of Patent: Nov. 26, 1991

[54] ION IMPLANTATION APPARATUS

[75] Inventors: Mamoru Nogami; Kazuhiro Nishikawa, both of Kyoto, Japan

[73] Assignee: Nissin Electric Company, Limited, Kyoto, Japan

[21] Appl. No.: 522,788

[22] Filed: May 14, 1990

[30] Foreign Application Priority Data

May 15, 1989 [JP] Japan ................................. 1-122450
Jun. 1, 1989 [JP] Japan ................................. 1-140912

[51] Int. Cl.$^5$ .......................................... H01J 37/317
[52] U.S. Cl. .................................. 250/492.2; 250/398
[58] Field of Search ............. 250/492.21, 492.2, 492.3, 250/398, 492.21

[56] References Cited

U.S. PATENT DOCUMENTS 4,494,005  1/1985  Shibata et al. .................... 250/492.2
4,922,106  5/1990  Berrian et al. .................... 250/492.2
4,983,850  1/1991  Tsukakoshi et al. ............ 250/492.21

Primary Examiner—Jack I. Berman
Attorney, Agent, or Firm—Finnegan, Henderson, Farabow, Garrett, and Dunner

[57] ABSTRACT

An ion implantation apparatus comprises a pair of scanning electrodes for statically scanning an ion beam in an X direction; a drive unit for mechanically scanning a target in a Y direction substantially perpendicular to the X direction; a scanning power supply including a signal generator for generating a signla with a waveform corresponding to waveform data which is input from an outside and an amplifier for amplifying the signal and for outputting it to the pair of scanning electrodes; a multiple point monitor containing a large number of Faraday cups with same area disposed in the X direction for receiving the ion beam and for measuring the beam current; a monitor drive unit for moving the multiple point monitor to and from a radiation area of the scanned ion beam; and a control unit for obtaining the distribution of the beam current sum being entered into each Faraday cup according to the beam current measured by each Faraday cup of the multiple point monitor, for generating the waveform data so that the distribution of the beam current sum becomes flat, and for inputting the resultant data to the signal generator of the scanning power supply.

3 Claims, 4 Drawing Sheets

ION IMPLANTATION APPARATUS

BACKGROUND OF THE INVENTION

The present invention relates to a hybrid scan type ion implantation apparatus in which an ion beam is electrostatically scanned and a target is mechanically scanned in the direction perpendicular to the ion beam.

FIG. 1 shows a prior art ion implantation apparatus.

In this ion implantation apparatus, after an ion beam 2 is extracted from an ion source, which is subjected to mass analysis, acceleration, trimming, and so forth, if necessary, the ion beam 2 is electrostatically scanned in the X direction (for example, in the horizontal direction) by a pair of scanning electrodes 4 to which a scanning voltage is applied from a scanning power supply 12 so as to plainly spread the ion beam 2 in the X direction.

The scanning power supply 12 is provided with a generator 121 for generating a triangle wave signal at a particular frequency and high voltage amplifiers 122 and 123 for raising the voltage of the signal and for outputting reverse polarity voltages VX and −VX, respectively.

On the other hand, a target 6 (for example, a wafer) is held by a holder 8 in the radiation area of the ion beam 2. The target 6 is mechanically scanned by a drive unit 10 in the Y direction perpendicular to the X direction (for example, in the vertical direction). This mechanical scanning operation is associated with the scanning operation of the ion beam 2 so as to equally implant ions into the entire surface of the target 6.

In the ion implantation apparatus described above, the route of the ion beam 2 is varied in the following conditions.

(1) The properties of the ion beam 2 itself (for example, its energy, divergence angle, emittance, density, ion type, and so forth), (2) The mechanical properties of the scanning electrodes 4 (for example, its parallelism, helix angle, position against the ion beam 2, and so forth), (3) The electrical properties of the scanning electrodes 4 (for example, scanning voltage applied thereto, frequency, and so forth), and (4) The conditions in the vicinity of the route of the ion beam 2.

The conditions (2) and (4) of the above conditions are intrinsic to the ion implantation apparatus and thereby they do not vary depending on the implantation conditions. However, the conditions (1) and (3) vary depending on the implantation conditions. Moreover, the route of the ion beam 2 varies by a combination of each condition rather than by a single condition.

When the variation of the route occurs equally in the entire range of the beam route scanned on the surface of the target 6, no problem arises. However, when a part of the route varies, the scanning speed of the ion beam 2 varies only at a particular portion, thereby badly affecting the uniformity of the ion implantation to the target 6.

Normally, the nonuniformity of ion implantation can be maintained to 1% or less. However, recently, semiconductor devices are being formed on the surface of the target 6 with high integration and high performance. Thus, much higher uniformity is required than before.

SUMMARY OF THE INVENTION

An object of the present invention is to provide an ion implantation apparatus in which the uniformity of the ion implantation to the target is improved.

To accomplish the above object, the ion implantation apparatus according to the present invention comprises a scanning power supply including a signal generator for generating a signal with a waveform according to waveform data which is input from the outside and an amplifier for amplifying the signal and for outputting it to a pair of scanning electrodes, a multiple point monitor containing a large number of Faraday cups with the area disposed in the X direction for receiving the ion beam and for measuring the beam current, a monitor drive unit for moving the multiple point monitor to and from a radiation area of the scanned ion beam, and a control unit for obtaining the distribution of the beam current amount being entered into each Faraday cup according to the beam current measured by each Faraday cup of the multiple point monitor, for generating the waveform data so that the distribution of the beam current amount becomes equal, and for inputting the resultant data to the signal generator of the scanning power supply.

Also, instead of the above described control unit, another control unit may be provided for obtaining the distribution of the beam current amount being entered into each Faraday cup according to the beam current measured by each Faraday cup of the multiple point monitor, for compensating the distribution of the beam current amount so as to correspond to the distribution of the ion implantation amount on the target based on the previously obtained correlation between the two distributions, for generating the wave form data so that the distribution of the compensated beam current amount becomes equal, and for inputting the resultant data to the signal generator of the scanning power supply.

When an ion beam is scanned while the multiple point monitor is disposed in the radiation area of the ion beam, the beam current is measured by each Faraday cup in the position thereof. The distribution of the beam current amount (electric charge amount) being entered into each Faraday cup is obtained by the control unit according to the measured beam current. The control unit generates waveform data so that the distribution of the beam current amount becomes uniform.

The signal generator of the scanning power supply generates a signal with a waveform according to the waveform data. The signal is amplified and output to the scanning electrodes as a scanning voltage.

Thus, the uniformity of the ion implantation to the target obtained by the present invention is better than the uniformity obtained by the conventional type using a triangle wave scanning voltage.

When a control unit for compensating the distribution of the beam current amount on the multipoint monitor so as to correspond to the distribution of the ion implantation amount on the target is used, the difference in the conditions between the multipoint monitor and the target can be eliminated, so that the uniformity of the implantation to the target can be improved.

DETAILED DESCRIPTION OF THE INVENTION

Figure 2:
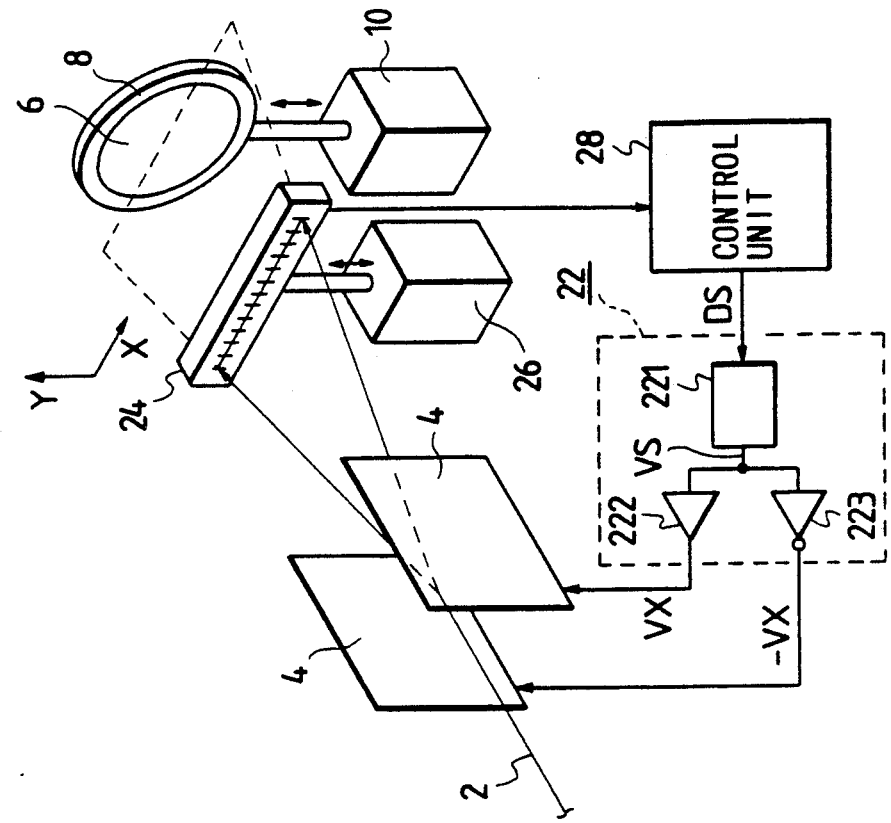
FIG. 2 is a view showing a part of an ion implantation apparatus according to an embodiment of the present invention.
Figure 1:
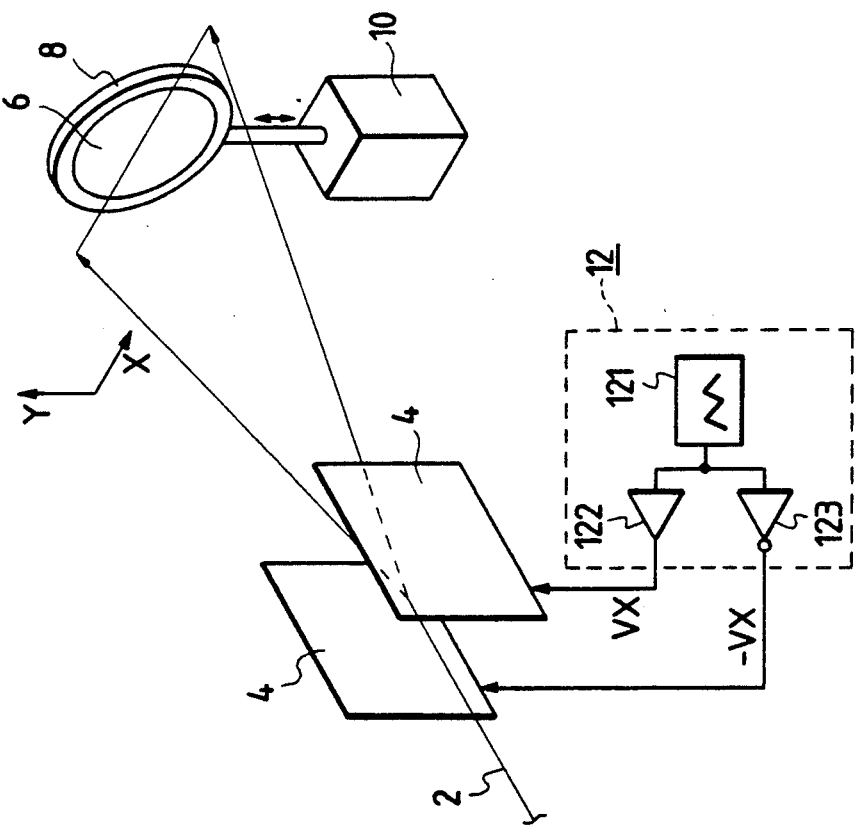
FIG. 1 is a view showing a part of a conventional ion implantation apparatus.

FIG. 2 is a view showing a part of an ion implantation apparatus according to a first embodiment of the present invention. The portions which are the same as those in FIG. 1 are designated by the same numerals. The different points from the prior art will be described in the following.

In this embodiment, a scanning power supply 22 for applying scanning voltages to scanning electrodes 4 is structured as follows.

The scanning power supply 22 is provided with an arbitrary waveform generator 221 for generating a scanning signal VS with a waveform according to waveform data from the outside (more practically, waveform data DS which is output from a control unit 28 described later) and high voltage amplifiers 222 and 223 for raising the voltage of the scanning signal VS and for outputting respective reverse polarity scanning voltages VX and −VX.

The arbitrary waveform generator 221 is of a known type. By programming the arbitrary waveform generator or inputting waveform data from the outside, any waveform signal can be generated.

In addition, the ion implantation apparatus according to the embodiment is provided with a multiple point monitor 24 for measuring the distribution of beam current at each point of the ion beam 2, a monitor drive unit 26 for moving the multiple point monitor 24 to the radiation area for measurement and from the radiation area for the ion implantation operation to a target 6, and a control unit 28 for generating the waveform data DS described above and for outputting it to the scanning power supply 22.

Figure 3:
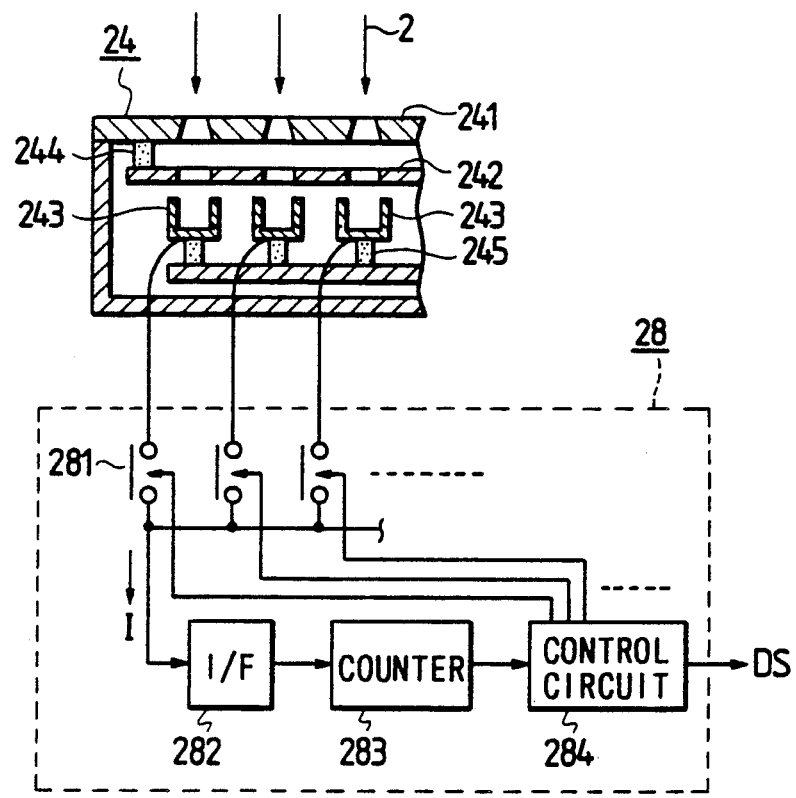
FIG. 3 is a view showing an example of a multiple point monitor and a control unit of FIG. 2.

As shown in FIG. 3, the multiple point monitor 24 is, for example, provided with a large number of Faraday cups 243 having the same area aligned in the X direction for receiving suppressers 242 with an opening section in the position corresponding to each Faraday cup 243, disposed in front thereof, masks 241 with an opening section in the position corresponding to each Faraday cup 243, disposed in front thereof, and support insulators 244 and 245.

As shown in FIG. 3, the control unit 28 is, for example, provided with a current/frequency converter 282 for converting a beam current I, which is output from each Faraday cup 243 of the multiple point monitor 24, into a frequency signal, a counter 283 for counting the frequency of the frequency signal so that the beam current I is converted into a digital signal to be applied to a control circuit 284, a large number of switches 281 for selectively switching each Faraday cup 243 of the multiple point 24 so as to connect it to the current/frequency converter 282 according to a command from the control circuit 284, and the control circuit 284 for obtaining the distribution of the beam current amount (electric charge amount) being entered into each Faraday cup 243 according to the data being input in the above manner and for generating the waveform data DS so that the distribution of the beam current amount becomes uniform. The control circuit includes a microcomputer in this example.

An example of a procedure for compensating a scanning voltage waveform will be described in the following.

(1) The multiple point monitor 24 is driven by the monitor drive unit 26 so as to move to the radiation area of the ion beam 2.

Figure 4:
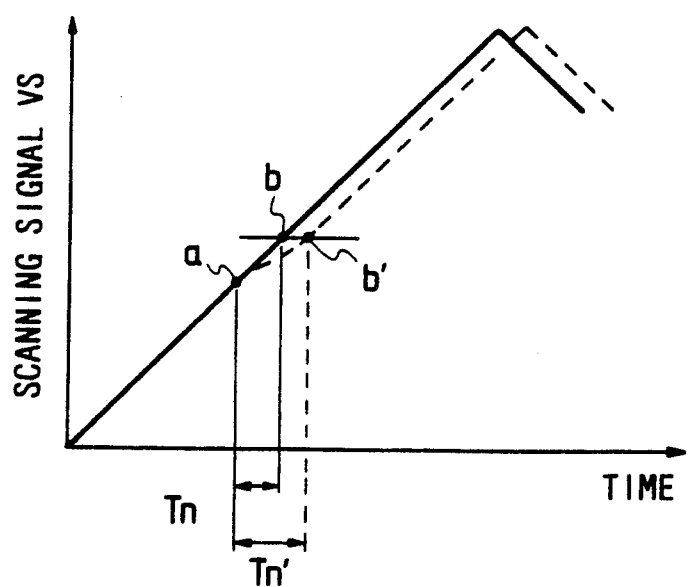
FIG. 4 is a view showing an example of a scanning signal waveform.

(2) Then, for example, the triangle wave scanning signal VS as shown by the solid line in FIG. 4 is output from the arbitrary waveform generator 221 so as to scan the ion beam 2. The beam current amount which is entered into each Faraday cup 243 of the multiple point monitor 24 is successively obtained in the control circuit 284.

In other words, only one switch 281 corresponding to the Faraday cup 243 to be measured is turned on so as to measure the beam current I which is entered into the Faraday cup 243. According to the beam current I being measured, the beam current amount per unit scanning operation of the ion beam 2 (for example, one way scanning operation, two way scanning operation, and so forth) is cumulated. This operation is successively repeated for each Faraday cup 243.

(3) In the control circuit 284, the distribution of the beam current amount being entered into each Faraday cup 243 according to the data measured in the manner described above is obtained and the waveform data DS for equalizing the distribution is computed.

In this case, since the area of each Faraday cup 243 is the same, the beam current amount of each Faraday cup 243 being measured is proportional to the ion implantation amount per unit area against the target 6. Thus, in the control circuit 284, the waveform data DS is generated in such a manner that the scanning speed of the ion beam 2 is high for a portion where the beam current amount is high and the scanning speed is low for a portion where the beam current amount is low.

For example, when the scanning signal VS is a triangle wave as shown by the solid line in FIG. 4, let us assume that only the beam current amount which is entered into the n-th Faraday cup 243 is smaller than others. Further, let us assume that between points a and b the ion beam 2 is entered into the n-th Faraday cup 243 and that the time period is Tn.

In the control circuit 284, the time period Tn, where the beam current amount (=beam current×time period) entered into the Faraday cup 243 becomes the same as that of others (in this case, Tn' > Tn), is computed by using the beam current which flows in the Faraday cup 243. At the time, since the magnification of the scanning signal V after the time period Tn should be same as that after the time period Tn' (namely, their scanning width is the same), the position of the point b' is determined. As shown by the broken line in FIG. 4, the line which is connected between the points a and b' becomes a waveform which has been compensated. In the waveform following the point b', no compensation is required. Thus, it is possible to translate the former triangle wave in parallel.

When the beam current amount which is entered into the n-th Faraday cup 243 is more than others, the slope between the points a and b' is increased opposite to the above case so that the time period Tn' is shorter than Tn.

The control circuit 284 generates the waveform data DS which is a source for the waveform of the compensated scanning signal VS. The waveform data DS is input to the arbitrary waveform generator 221 of the scanning power supply 22. The arbitrary waveform generator 221 holds the waveform data DS and outputs the scanning signal VS whose waveform corresponds to the data DS.

(4) In the same manner described above, the distribution of the beam current amount which is entered into each Faraday cup 243 is obtained. When the specified uniformity is obtained, the waveform compensation is completed. When the specified uniformity is not obtained, the waveform compensation as described above is executed again.

(5) After the specified uniformity is obtained, the multiple point monitor 24 is moved from the radiation area of the ion beam 2. After that, ions are implanted to the target 6.

In the manner described above, since the uniformity of the beam current amount being entered into each Faraday cup 243 of the multiple point monitor 24 becomes higher than the specified value, the uniformity of the ion implantation against the target 6 is improved over than that of the prior art.

Figure 6:
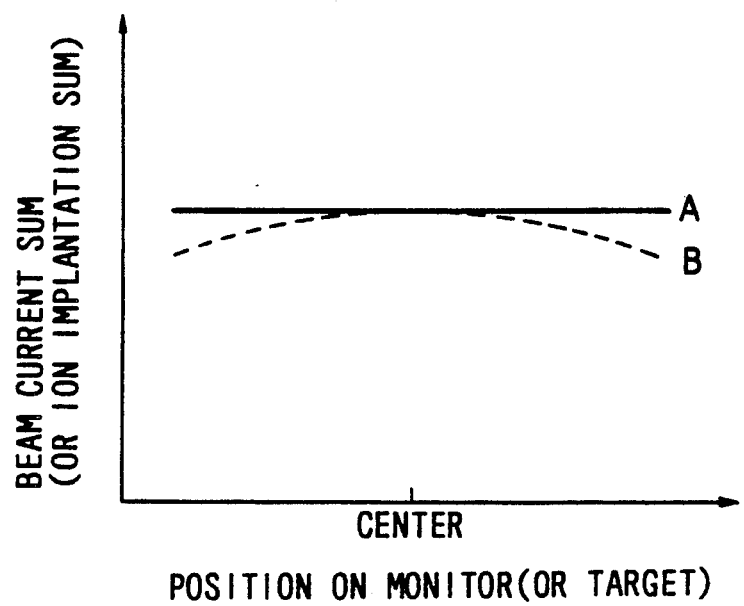
FIG. 6 is a view showing an example of the correlation between the distribution of a beam current amount on a multiple point monitor and the distribution of an ion implantation amount on a target.

Strictly speaking, since the conditions of the multiple point monitor 24 and the target 6, such as the difference of position between both, are different, even if the distribution of the beam current amount on the target 6 is equalized as shown by curve A in FIG. 6, the distribution of the ion implantation amount on the target 6 may not be necessarily equalized as shown by curve B in FIG. 6.

In order to eliminate the deficiency, another kind of control unit may be used. That is, the correlation between the distribution of the beam current amount on the multiple point monitor 24 and the distribution of the ion implantation amount on the target 6, for example, the correlation as shown in FIG. 6 in which when the distribution of the beam current amount on the multiple point monitor 24 is as shown by curve A, the distribution of the ion implantation amount on the target 6 is as shown by curve B (the correlation is intrinsic to the ion implantation apparatus) is previously obtained and data showing the correlation is stored in the control circuit 284 of the control unit 28. Based on the data, the control circuit 284 compensates the distribution of the beam current amount measured on the multiple point monitor 24 to correspond (for example, to coincide) to the distribution of the ion implantation amount on the target 6. Then the waveform data DS to equalize the distribution of the compensated beam current amount is calculated in the same way as described above, which is applied to the scanning power source 22. In this way, the difference in the conditions between the multiple point monitor 24 and the target 6 can be eliminated, so that the uniformity of the implantation to the target 6 can be improved.

Figure 5:
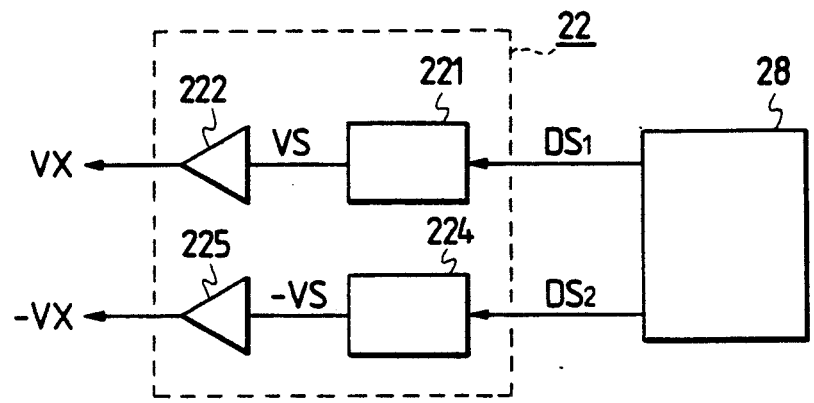
FIG. 5 is a block diagram showing another example of a scanning power supply.

As shown in FIG. 5, it is also possible to structure the scanning power supply 22, for example, with two arbitrary waveform generators 221 and 224 for receiving waveform data DS1 and DS2 from a control unit 28 and for generating reverse polarity scanning signals VS and −VS and two high voltage amplifiers 222 and 225 for raising the voltages of the signals and for outputting reverse polarity scanning voltages VX and −VX. The waveform data DS1 and DS2 which are computed from the control unit 28 in the same manner described above are output to the arbitrary waveform generators 221 and 224, respectively. In this structure, since the waveforms of the scanning voltages supplied to the scanning electrodes 4 can be independently varied on the VX side and the −VX side, the compensation can be more precisely conducted.

In addition, to supply the beam current I from each Faraday cup 243 of the multiple point monitor 24 to the control circuit 284, it is not always necessary to use the current/frequency converter 282 and the counter 283 as described above. Rather, other means may be used.

Further, instead of the above described linear movement, swing rotation may be used for mechanically driving the target 6 in the Y direction substantially perpendicular to the X direction of the scanning direction of the ion beam 2.

Figure 7:
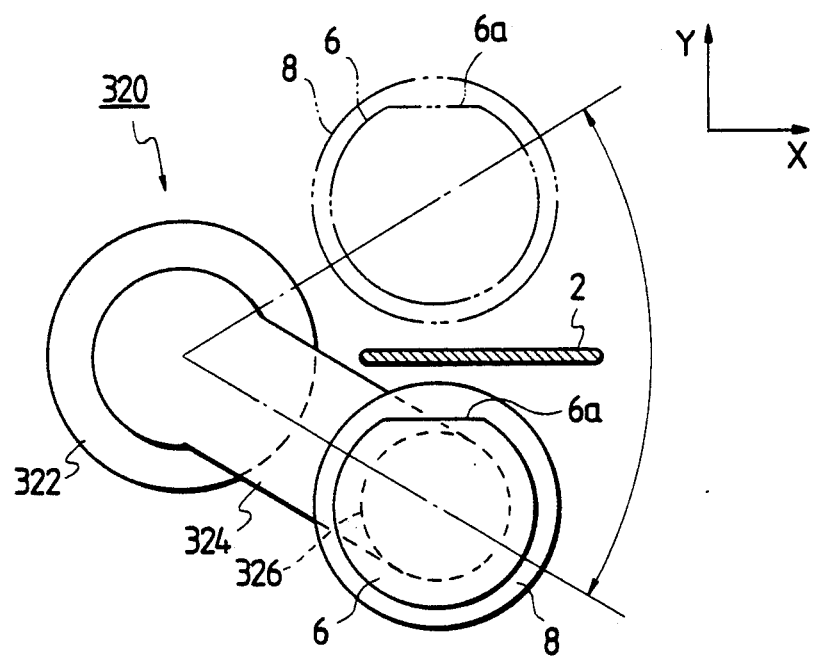
FIG. 7 is a view showing an example of a drive unit for a target.

The drive unit 320 as shown in FIG. 7 is an example of such a drive means.

The drive unit 320 comprises an arm 324 for supporting a holder 8, and a reversibly rotatable motor 322 (for example, direct drive motor) for rotating the arm 324 as shown by an arrow shown in FIG. 7. The reciprocating movement of the motor 322 causes the target 6 held by the holder 8 to be mechanically scanned in the Y direction substantially perpendicular to the X direction in an arc shape while the target faces the ion beam 2.

In this case, in order to maintain the posture of the target 6 (for example, the direction of the orientation flat 6a) at the scanning of the target 6, means for rotating the holder 8 in accordance with the rotation of the arm 324 may be provided. For example, as in this example, a reversibly rotatable motor (for example, direct drive motor) 326 is fixed to the arm 324, the holder 8 is fixed to the output shaft of the motor 326, and the holder 8 is rotated by the motor 326 by the same angle in the reverse direction to the rotation direction of the arm 324. Thus the posture of the target 6 can be maintained.

Further, the ion beam 2 converted into a parallel beam by electrically scanning the beam to the X direction may be irradiated to the target 6.

Figure 8:
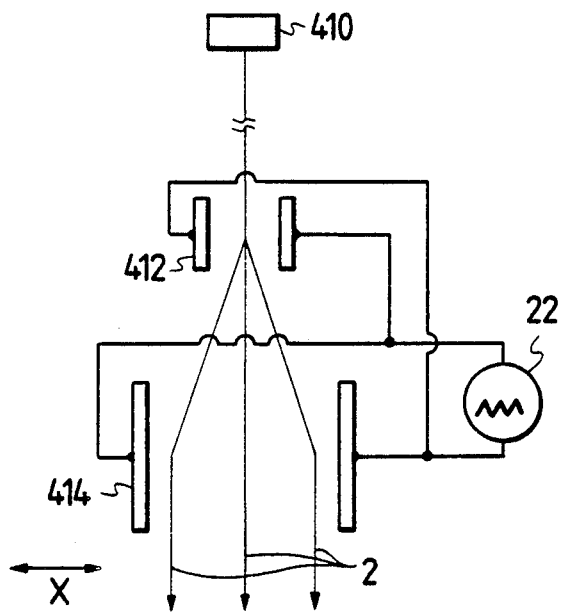
FIG. 8 is an example of an electrical scanning means for an ion beam.

FIG. 8 shows an example of such a scanning means of the ion beam 2. The ion beam 2 extracted from an ion source 410, and subjected to mass analysis, acceleration and the like, if necessary, is scanned in the X direction by cooperation of the two pairs of scanning electrodes 412 and 414, to which reverse polarity scanning voltages (triangular wave voltages) are applied from the same scanning power source 22, so that the beam exiting from the scanning electrode 414 is converted into a parallel beam. The ion beam 2 may be converted into the parallel beam by using magnetic field rather than the electric field of this example.

Moreover, in this disclosure, the X direction and the Y direction only refer to two directions, one of which is perpendicular to the other. Thus, it is possible to consider the X direction as the horizontal direction, the vertical direction, or any inclined direction thereto.

As described above, according to the present invention, the uniformity of the ion beam during scanning is measured and the scanning voltage waveform can be compensated according to the resultant data so as to improve the uniformity. Thus, the uniformity of the ion implantation to the target can be improved over that of a prior art using a triangle wave scanning voltage.

Further, when a control unit for compensating the distribution of the beam current amount on the multiple point monitor to correspond to the distribution of the ion implantation amount on the target is used, the difference in the conditions between the multiple point monitor and the target can be eliminated. Thus the uniformity of the implantation to the target can be improved.

What is claimed is:

1. An ion implantation apparatus, comprising:
   a pair of scanning electrodes for electrostatically scanning an ion beam in an X direction;
   a drive unit for mechanically scanning a target in a Y direction substantially perpendicular to the X direction;
   a scanning power supply including a signal generator for generating a signal with a waveform according to waveform input data, and an amplifier for amplifying the signal and for outputting said amplified signal to said pair of scanning electrodes;
   a multiple point monitor containing a large number of Faraday cups with the same area disposed in the X direction for receiving the ion beam and for measuring beam current;
   a monitor drive unit for moving said multiple point monitor to and from a radiation area of the scanned ion beam; and
   a control unit for obtaining the distribution of a beam current sum being entered into each of said Faraday cups according to the beam current measured by each of said Faraday cups of said multiple point monitor, for generating said waveform data so that the distribution of the beam current sum becomes flat, and for inputting the resultant data to the signal generator of said scanning power supply;
   wherein said drive unit comprises an arm for supporting a holder for holding said target, and a reversibly rotatable motor for rotating said arm so that said target is scanned in an arc form while said target faces to said ion beam.

2. An ion implantation apparatus, comprising:
   a pair of scanning electrodes for electrostatically scanning an ion beam in an X direction;
   a drive unit for mechanically scanning a target in a Y direction substantially perpendicular to the X direction;
   a scanning power supply including a signal generator for generating a signal with a waveform according to waveform input data and an amplifier for amplifying the signal and for outputting said amplified signal to said pair of scanning electrodes;
   a multiple point monitor containing a large number of Faraday cups with the same area disposed in the X direction for receiving the ion beam and for measuring beam current;
   a monitor drive unit for moving said multiple point monitor to and from a radiation area of the scanned ion beam; and
   a control unit for obtaining the distribution of a beam current sum being entered into each of said Faraday cups according to the beam current measured by each of said Faraday cups of said multiple point monitor, for compensating the distribution of the beam current sum to correspond to the distribution of the ion implantation sum on said target on the basis of previously obtained correlation between the distribution of the beam current sum and the distribution of the ion implantation sum, generating said waveform data so that the distribution of the compensated beam current sum becomes flat, and for inputting the resultant data to said signal generator of said scanning power supply.

3. The ion implantation apparatus of claim 2, further comprising means for converting said ion beam into a parallel beam, said means for converting said ion beam into a parallel beam comprising a pair of collimating electrodes for electrostatically collimating said ion beam, wherein said collimating electrodes are supplied with a signal comprising the inverse of the signal supplied to said scanning electrodes.

* * * * *